United States Patent
Liao et al.

(10) Patent No.: US 8,207,783 B2
(45) Date of Patent: Jun. 26, 2012

(54) CIRCUIT AND METHOD FOR CHARACTERIZING THE PERFORMANCE OF A SENSE AMPLIFIER

(75) Inventors: Wei-Li Liao, Taichung (TW); Sung-Chieh Lin, Zhubei (TW); Kuoyuan Hsu, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 73 days.

(21) Appl. No.: 12/856,824

(22) Filed: Aug. 16, 2010

(65) Prior Publication Data

US 2012/0038410 A1 Feb. 16, 2012

(51) Int. Cl.
*H01H 37/76* (2006.01)
(52) U.S. Cl. .................................. 327/525; 327/308
(58) Field of Classification Search .......... 327/308, 327/525, 560
See application file for complete search history.

(56) References Cited

U.S. PATENT DOCUMENTS

| | | | |
|---|---|---|---|
| 5,418,487 A * | 5/1995 | Armstrong, II | 327/525 |
| 7,224,633 B1 | 5/2007 | Hovis et al. | |
| 7,459,956 B2 * | 12/2008 | Chung et al. | 327/525 |
| 7,750,716 B2 * | 7/2010 | Hosoya | 327/308 |
| 8,058,921 B2 * | 11/2011 | Li et al. | 327/525 |
| 2007/0157140 A1 | 7/2007 | Holesovsky et al. | |
| 2008/0253042 A1 | 10/2008 | Arsovski | |
| 2009/0175106 A1 | 7/2009 | Aipperspach et al. | |
| 2010/0067319 A1 | 3/2010 | Aipperspach et al. | |

* cited by examiner

*Primary Examiner* — Jeffrey Zweizig
(74) *Attorney, Agent, or Firm* — Duane Morris LLP

(57) ABSTRACT

An integrated circuit includes a sensing circuit, a fuse box, and a fuse bus decoder. The sensing circuit includes an output node, and the fuse box includes a plurality of switches coupled in series with a plurality of resistive elements. The fuse box is coupled to the output node of the sensing circuit from which the fuse box is configured to receive a current. The fuse bus decoder is coupled to the fuse box and includes at least one demultiplexer configured to receive a signal and in response output a plurality of control signals for selectively opening and closing the switches of the fuse box to adjust a resistance across the fuse box. A voltage of the output node of the sense amplifier is based on a resistance the fuse box and the current.

20 Claims, 7 Drawing Sheets

CIRCUIT AND METHOD FOR CHARACTERIZING THE PERFORMANCE OF A SENSE AMPLIFIER

FIELD

The disclosed system and method relate to integrated circuits. More specifically, the disclosed system and method relate to the characterization of a sense amplifier for an electronic fuse.

BACKGROUND

Electronic systems typically require the ability to enable, disable, or modify certain functions of an integrated circuit ("IC") chip after the IC has been manufactured. Such customization or modifications are typically achieved through blowing electronic fuses formed on the ICs. The fuses may include a silicided polysilicon conductor that is blown by directing a current of sufficient magnitude and duration through the fuse to melt or electromigrate at least a portion of the silicide between the first and second ends of the fuse.

Sense amplifiers are implemented with fuses for sensing the state of an fuse, i.e., a high resistance state when the fuse is blown and a low resistance state when the fuse is unblown or intact. However, the performance of the sense amplifier cannot be independently characterized in silicon and may only be characterized through simulations, which are not always accurate due to variances in process, voltage, and temperature ("PVT"). Consequently, the sensing margin of the sense amplifier may not be accurately determined through simulations resulting in poor performance of the IC. For example, if the resistance of a blown fuse is 5 kΩ and the resistance of an intact fuse is 200Ω, then the sense amplifier will accurately read data if the sense amplifier trip point for a "read high" state is less than 5 kΩ and the trip point for a "read low" state is greater than 200Ω. However, if the sense amplifier has a trip point for a read high that is above 5 kΩ or a trip point for a read low that is below 200Ω, then the data cannot be accurately read.

DETAILED DESCRIPTION

Figure 1:
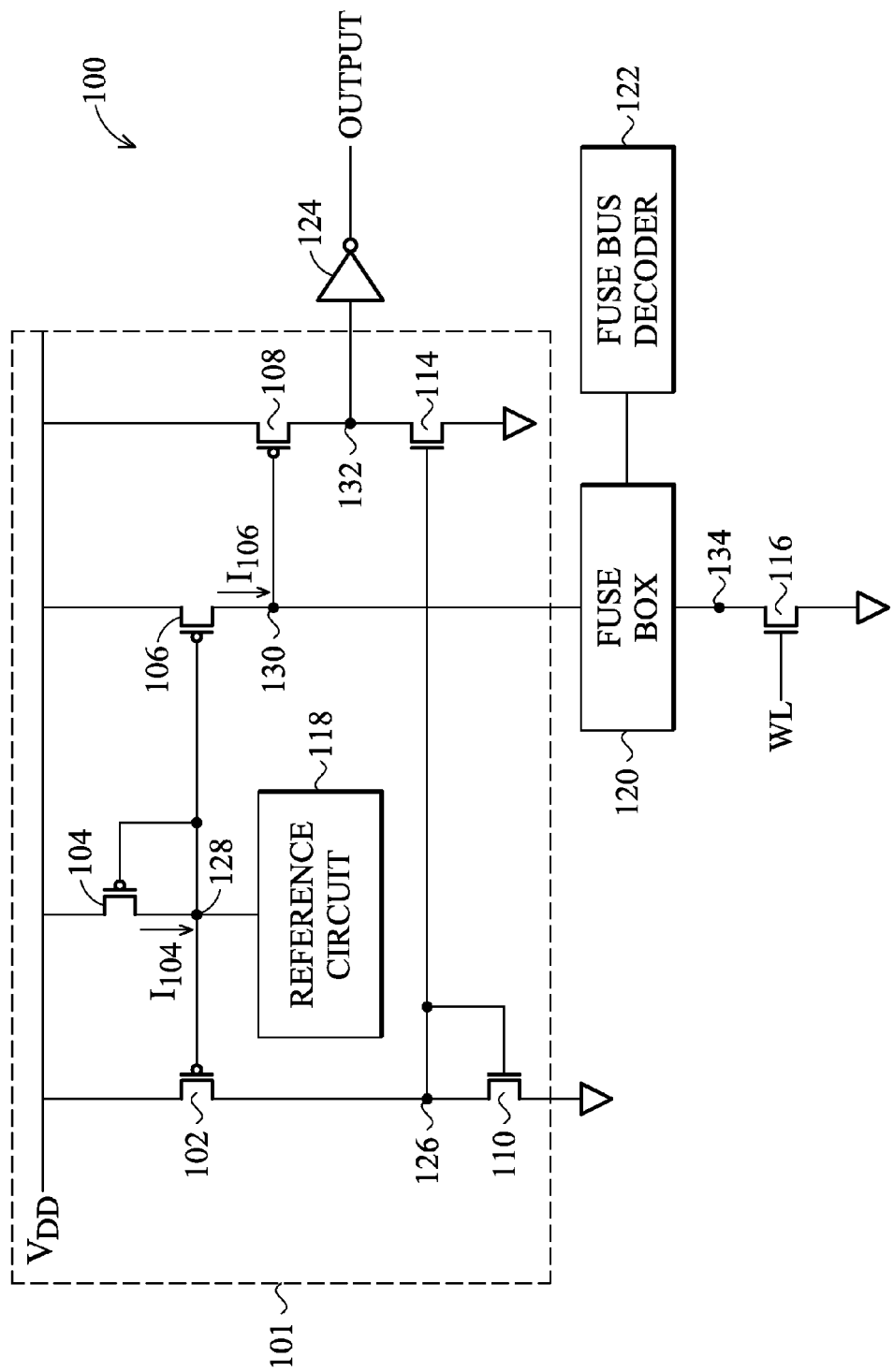
FIG. 1 illustrates one example of a fuse box calibration circuit.

FIG. 1 illustrates one example of an electrical fuse sense amplifier (SA) calibration circuit 100. SA calibration circuit 100 includes a plurality of PMOS transistors 102-108 and NMOS transistors 110-116 forming a sense amplifier 101, a reference circuit 118, a fuse box 120, a fuse bus decoder 122, and an inverter 124.

PMOS transistor 102 has its source coupled to positive supply voltage $V_{DD}$ and its drain coupled to node 126, which is coupled to the drain of NMOS transistor 110. The gate of PMOS transistor 102 is coupled to the gate and drain of PMOS transistor 104 at node 128, which is also coupled to reference circuitry 118. PMOS transistor 106 has its gate coupled to node 128 and its drain coupled to node 130, which is coupled to the gate of PMOS transistor 108 and to fuse box 120.

Fuse box 120 is coupled to fuse box decoder 122 and to the drain of NMOS transistor 116, which has its gate coupled to a word line (WL) and its source coupled to $V_{SS}$, e.g., ground. The drain of PMOS transistor 108 is coupled to node 132, which is coupled to the input of inverter 124 and to the drain of NMOS transistor 114. NMOS transistor 114 has its source coupled to low voltage supply $V_{SS}$ and its gate coupled to node 126.

Figure 2A:
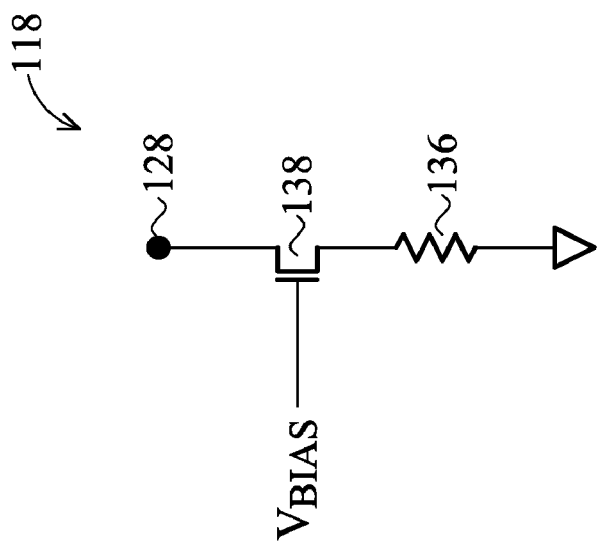
FIGS. 2A and 2B illustrate examples of a reference circuit in accordance with the fuse box calibration circuit illustrated in FIG. 1.
Figure 2B:
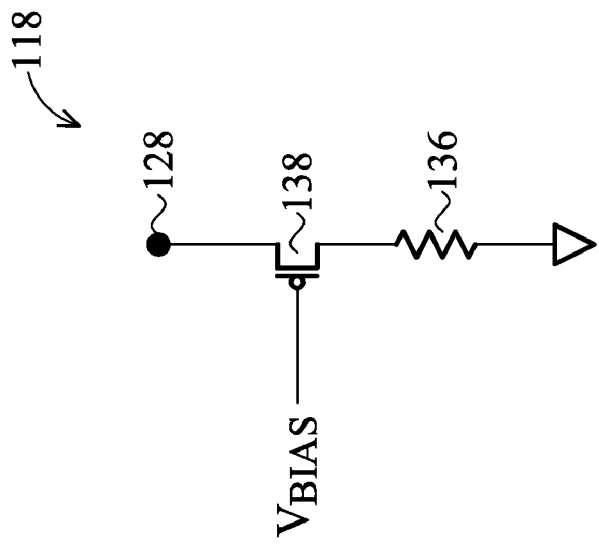

Transistors 102 and 110 provide bias voltages to the gate of transistors 106 and 114. The current through transistor 104, $I_{104}$, is determined by setting the resistance of reference circuit 118, and is mirrored by a current, $I_{106}$, through transistor 106 (i.e., transistors 104 and 106 form a current mirror). In some embodiments, reference circuit 118 includes a resistor 136 coupled between low voltage source $V_{SS}$ and a MOS transistor 138 as shown in FIGS. 2A and 2B. MOS transistor 138 may have its drain coupled to resistor 136, its source coupled to node 128, and its gate coupled to a bias voltage, $V_{BIAS}$. The voltage at node 130, which is coupled to the gate of transistor 108, is adjusted by changing the resistance across fuse box 120. The voltage of node 130 controls the opening and closing transistor 108, which results in the voltage at node 132 being adjusted between $V_{DD}$ and $V_{SS}$. The voltage at node 132 is inverted through inverter 124 and used as the output of the calibration circuit 100, which may be coupled to a testing device, such as automated test equipment ("ATE"), or other circuitry as will be understood by one skilled in the art.

Figure 3:
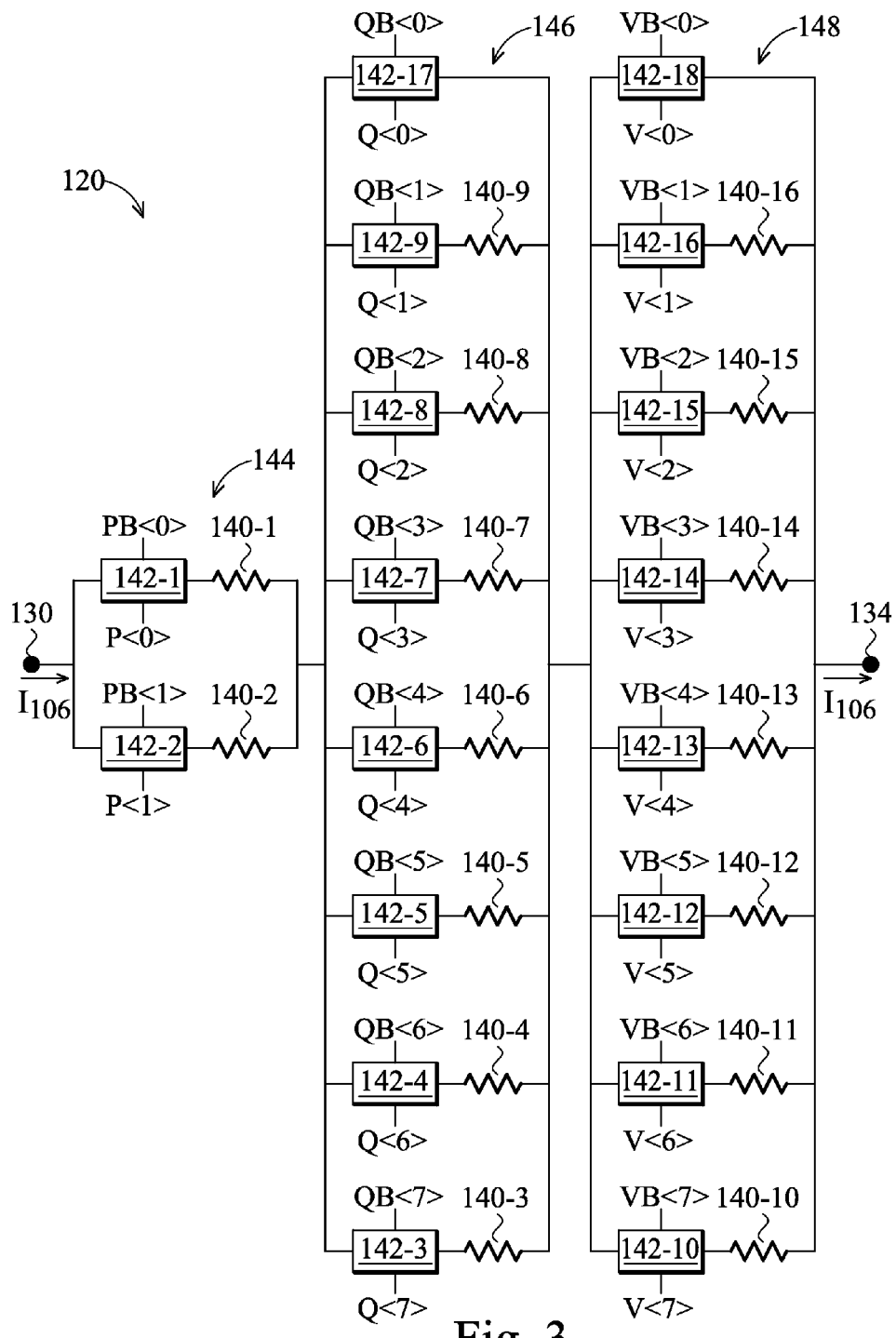
FIG. 3 illustrates one example of a fuse box in accordance with the fuse box calibration circuit illustrated in FIG. 1.
Figure 4:
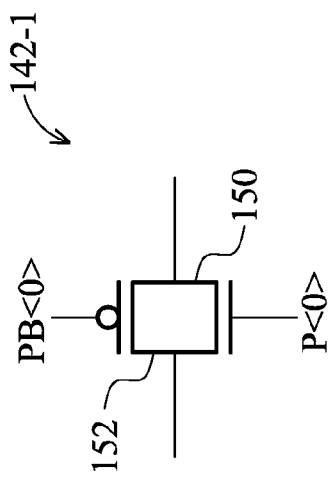
FIG. 4 illustrates one example of a pair of pass gates in accordance with the fuse box illustrated in FIG. 3.

FIG. 3 illustrates one example of fuse box 120. As shown in FIG. 3, fuse box 120 includes a plurality of resistors 140-1:140-16 (collectively referred to as "resistors 140") each coupled in series with a respective pass gate 142-1:142-16 (collectively referred to as "pass gates 142"). Resistors 140 may include any resistive element or circuit and one or more of the pass gates 142 may be implemented as a switch or single transistor. Each of the pass gates 142 includes an NMOS transistor 150 coupled to a PMOS transistor 152 as shown in FIG. 4. The gates of NMOS and PMOS transistors 150, 152 are coupled to complementary signal lines provided by fuse bus decoder 122 for controlling the opening and closing of pass gates 142.

The resistors 140 and pass gates 142 may be arranged in a plurality of columns, rows, or other configurable resistance segments 144, 146, and 148, with each configurable resistance segment coupled to the other columns in series. For example, segment 144 includes resistor 140-1 coupled in series with pass gate 142-1, which are both coupled in parallel with resistor 140-2 and pass gate 142-2. Segment 146 includes resistors 140-3:140-9, which are coupled to each other in parallel and are each coupled in series with a respective pass gate 142-3:142-9. Configurable resistance segment 146 also includes pass gate 142-17, which is coupled in parallel with each of resistors 140-3:140-9 and pass gates 142-3:142-9. Similarly, configurable resistance segment 148 includes resistors 140-10:140-16 coupled in parallel with each other and each coupled in series with a respective pass gate 142-10:142-16. Pass gate 142-18 is coupled in parallel with each of the resistors 140-10:140-16 and pass gates 142-10:142-16 in configurable resistance segment 148. Although three segments are illustrated in FIG. 3, one skilled in the art will understand that fewer or more configurable resistance segments may be implemented with each of the segments including one or more resistors 140 and pass gates 142.

Resistors 140 may each have different resistance values to enable a wide variety resistances to be tested between nodes 130 and 134. For example, Table 1 below provides examples of resistance values for each of the resistors illustrated in FIG. 3.

TABLE 1

| Resistor | Resistance |
|---|---|
| 140-1 | 100 Ω |
| 140-2 | 200 Ω |
| 140-3 | 1.4 kΩ |
| 140-4 | 1.2 kΩ |
| 140-5 | 1 kΩ |
| 140-6 | 800 Ω |
| 140-7 | 600 Ω |
| 140-8 | 400 Ω |
| 140-9 | 200 Ω |
| 140-10 | 11.2 kΩ |
| 140-11 | 9.6 kΩ |
| 140-12 | 8 kΩ |
| 140-13 | 6.4 kΩ |
| 140-14 | 4.8 kΩ |
| 140-15 | 3.2 kΩ |
| 140-16 | 1.6 kΩ |

The resistance values of resistors 140 set forth above in Table 1 enables the fuse resistance measurement to be obtained in 100Ω increments between 100Ω and 12.8 kΩ by selectively opening and closing pass gates 142 to couple together resistors in the three segments 144, 146, and 148. One skilled in the art will understand that the resistance values of resistors 140 may be adjusted to provide different levels of calibration as described below.

Figure 5:
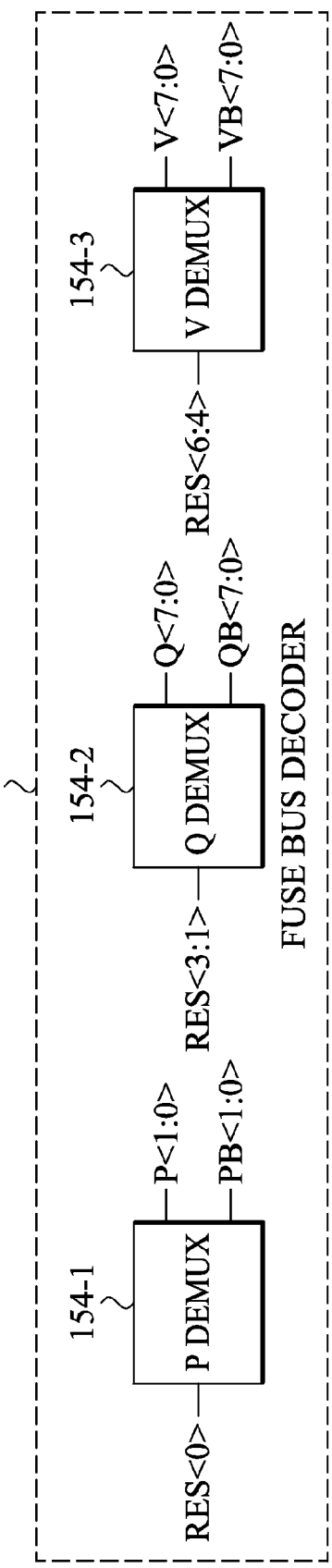
FIG. 5 illustrates one example of a fuse bus decoder in accordance with the fuse box calibration circuit illustrated in FIG. 1.

FIG. 5 illustrates one example of fuse bus decoder 122 shown in FIG. 1. As shown in FIG. 5, fuse bus decoder 122 includes a plurality of demultiplexers 154-1, 154-2, and 154-3 (collectively "demultiplexers 154") each receiving at least one signal, RES<0:6>, at input and outputting a plurality of complementary control signals, P<0:1> and PB<0:1>, Q<0:7> and QB<0:7>, and V<0:7> and VB<0:7>, to fuse box 120. In some embodiments, RES signals are provided by ATE by a connection to a wafer pad (not shown) as will be understood by one skilled in the art. In some embodiments, RES signals are provided by other circuits or devices as will be understood by one skilled in the art. As best seen in FIGS. 3 and 5, demultiplexer ("demux") 154-1 receives signals RES<0:1> and outputs signals P<0:1> and PB<0:1> to pass gates 142-1 and 142-2 in segment 144 of fuse box 120. Similarly, demux 152-2 receives RES signals RES<1:3> and outputs complementary signals Q<0:7> and QB<0:7> to pass gates 142-3:142-9 and 142-17 in segment of 146 of fuse box 120, and demux 152-3 receives RES signals RES<1:3> and outputs complementary signals V<0:7> and VB<0:7> to pass gates 142-10:142-16 and 142-18 in segment 148 of fuse box 120. One skilled in the art will understand that in alternative embodiments, fewer or more signals are provided to fuse box 120 from more or fewer demultiplexers 154.

Figure 6:
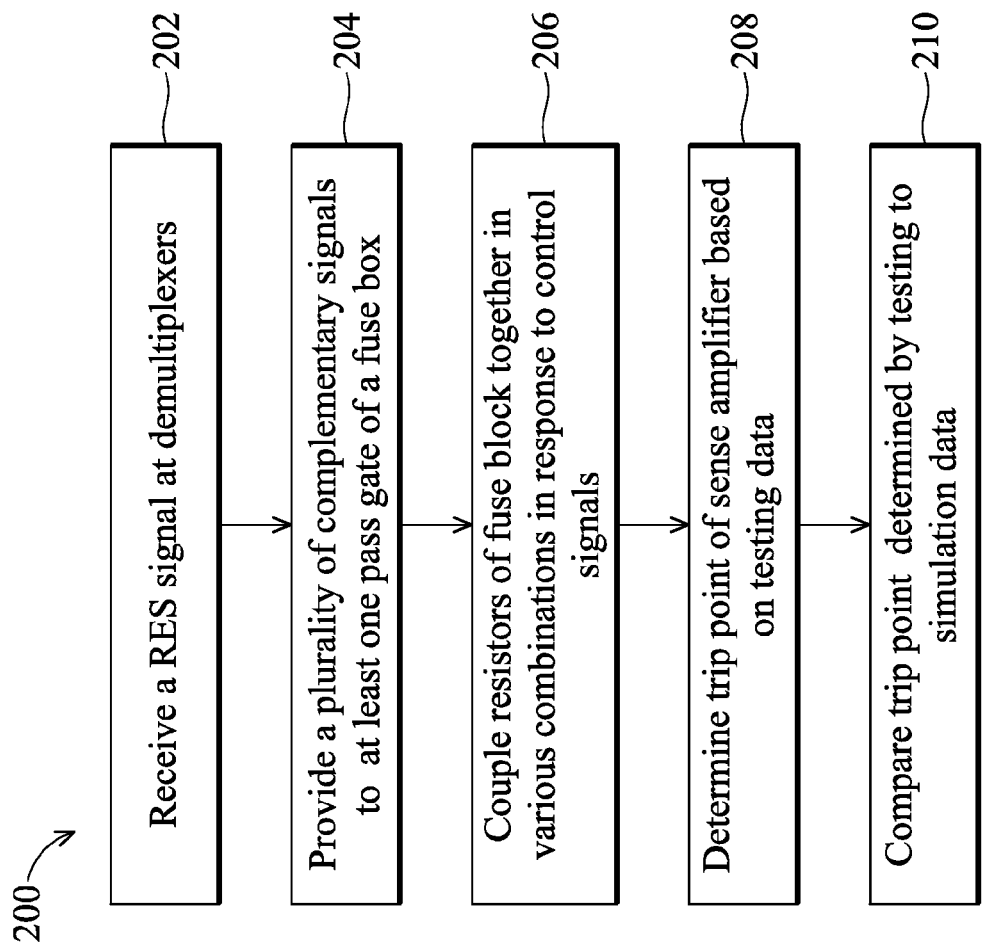
FIG. 6 is a flow diagram illustrating one example of a calibration method.

The operation of calibration circuit 100 is described with reference to FIGS. 1-6. As shown in FIG. 6, RES signals are provided to demultiplexers 154 from a wafer pad (not shown) at block 202. RES signals are provided by an ATE, which may include leads for connecting a computer or other testing device to pads on the integrated circuit or wafer on which the calibration circuit is disposed as will be understood by one skilled in the art. The ATE may provide a plurality of different RES signals for testing each of the resistance combinations of fuse box 120.

At block 204, demultiplexers 154 demultiplex the RES signals and output a plurality of control signals for opening and closing the transistors 150 and 152 of pass gates 142 thereby adjusting the resistance across fuse box 120, i.e., the resistance between nodes 130 and 134, as different resistors 140-1:140-16 are coupled together. For example, demux 154-1 receives RES<0> and provides a signal P<0> to the gate of NMOS transistor 150 of pass gate 142-1; provides signal PB<0> to the gate of PMOS transistor 152 of pass gate 142-1; provides signal P<1> to the gate of NMOS transistor 150 of pass gate 142-2; and provides signal PB<1> to the gate of PMOS transistor 152 of pass gate 142-2. Demultiplexers 154-2 and 154-3 respectively receive signals RES<1:3> and RES<4:6> and output signals Q<0:7>, QB<0:7>, V<0:7>, and VB<0:7> to configurable resistance segments 146 and 148 of pass gates 142.

In response to receiving the complementary control signals from demultiplexers 154, pass gates 142 selectively couple resistors 140 to one another in various combinations for providing a plurality of different resistances across fuse box 120 at block 206. The resistance across fuse box 120 may be incrementally increased between 100Ω and 12.8 kΩ in 100Ω increments by opening and closing pass gates 142 to coupled together resistors 140 between nodes 130 and 134.

For example, pass gates 142-1, 142-17, and 142-18 may be turned into an 'on' state to couple together nodes 130 and 134 through resistor 140-1 and the remaining pass gates 142-2:142-16 are turned into an 'off' state such that each pass gate 142-2:142-16 effectively providing an open switch such that current cannot flow through each of the respective resistors 140-2:140-16 coupled in series with pass gates 142-2:142-16. Accordingly, the effective resistance between nodes 130 and 134 is the resistance of resistor 140-1.

In another example, pass gates 142-1, 142-3, and 142-10 may be switched into an on state such that nodes 130 and 134 are coupled together through resistors 140-2, 140-3, and 140-10. Consequently, the effective resistance across fuse box 120 is the sum of the resistance values of resistors 140-2, 140-3, and 140-10. One skilled in the art will understand that control signals may be supplied to pass gates 142 such that each of the possible resistance combinations across fuse box 120 may be tested.

As the resistance across fuse box 120 is incrementally adjusted, the voltage across fuse box 120, and consequently the voltage at node 130, is also adjusted due to the constant current $I_{106}$ being supplied through transistor 106, which mirrors the current $I_{104}$ through transistor 104 as described above. The voltage at node 130 controls the opening and closing of transistor 108 and the voltage at node 132. For example, when the voltage at node 130 is less than $V_{DD}$ by an amount greater than the threshold voltage, $V_{TH}$, then transistor 108 will be closed thereby allowing current will flow through transistor 108 and coupling $V_{DD}$ to node 132. Alternatively, if the voltage difference between the gate and source of transistor 108 is below $V_{TH}$, then transistor 108 will be open such that current will not flow through transistor 108 and $V_{DD}$ will not be passed to node 132. Node 132 instead will be pulled to $V_{SS}$ through NMOS transistor 114.

At block 208, the measurements obtained by the ATE, i.e., the voltage output by inverter 124, may be used to determine a trip point of the sense amplifier 101. For example, the ATE measures the output of inverter 124, i.e., a logic 'high' or '1' or a logic 'low' or '0', as each resistance combination of fuse box 120 is incrementally tested as described above. The resistance across fuse box 120 when the sense amplifier 101 switches its output from a read low state, i.e., the fuse is intact and there is a low resistance, to a read high state, i.e., the fuse is blown and there is a high resistance, is determined by identifying the RES signals at the time at which the sense amplifier 101 changes its output.

For example, if the sense amplifier changes its output when signals RES<0>, RES<2>, and RES<4> are logic ones, then pass gates 142-2, 142-8, and 142-13 are turned on such that resistors 140-2, 140-8, and 140-13 are coupled together in series between nodes 130 and 134 of fuse box 120. Accordingly, the resistance values of resistors 140-2, 140-8, and 140-13 are summed together to determine the trip point of sense amplifier 101.

Figure 7:
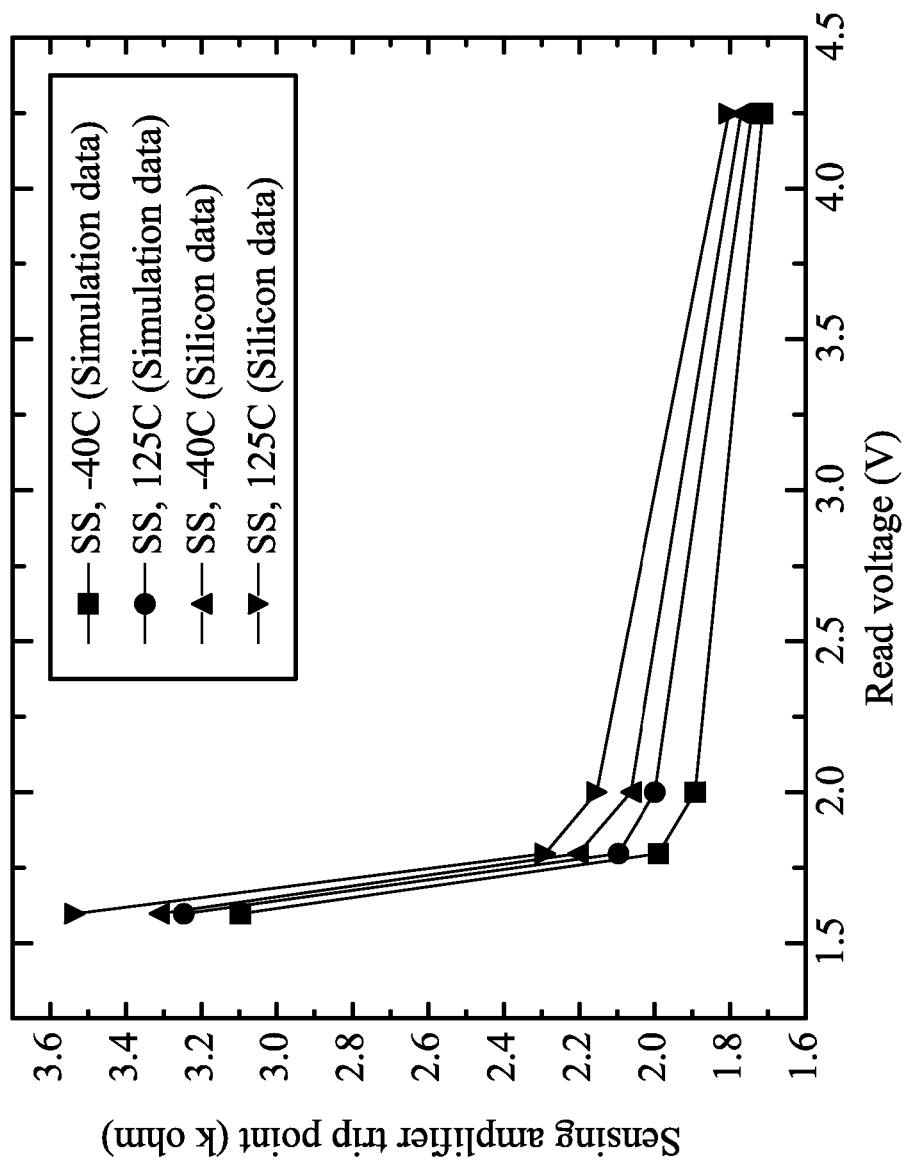
FIG. 7 is a trip point versus read voltage including simulation and silicon data for a sense amplifier.

At block 210, the trip points determined by the calibration circuit 100 may be compared to the simulation results of the sense amplifier 101 to confirm that the sense amplifier 101 operates in accordance with its intended design. For example, FIG. 7 is a graph illustrating the sensing amplifier trip point in kilo ohms versus read voltage in volts for simulated performance and testing performance (silicon data) for varying process, voltage, and temperature ("PVT") conditions. As shown in FIG. 7, the silicon data approximately parallels the simulation data thereby validating that the sense amplifier will operate in accordance with its intended design.

Figure 8:
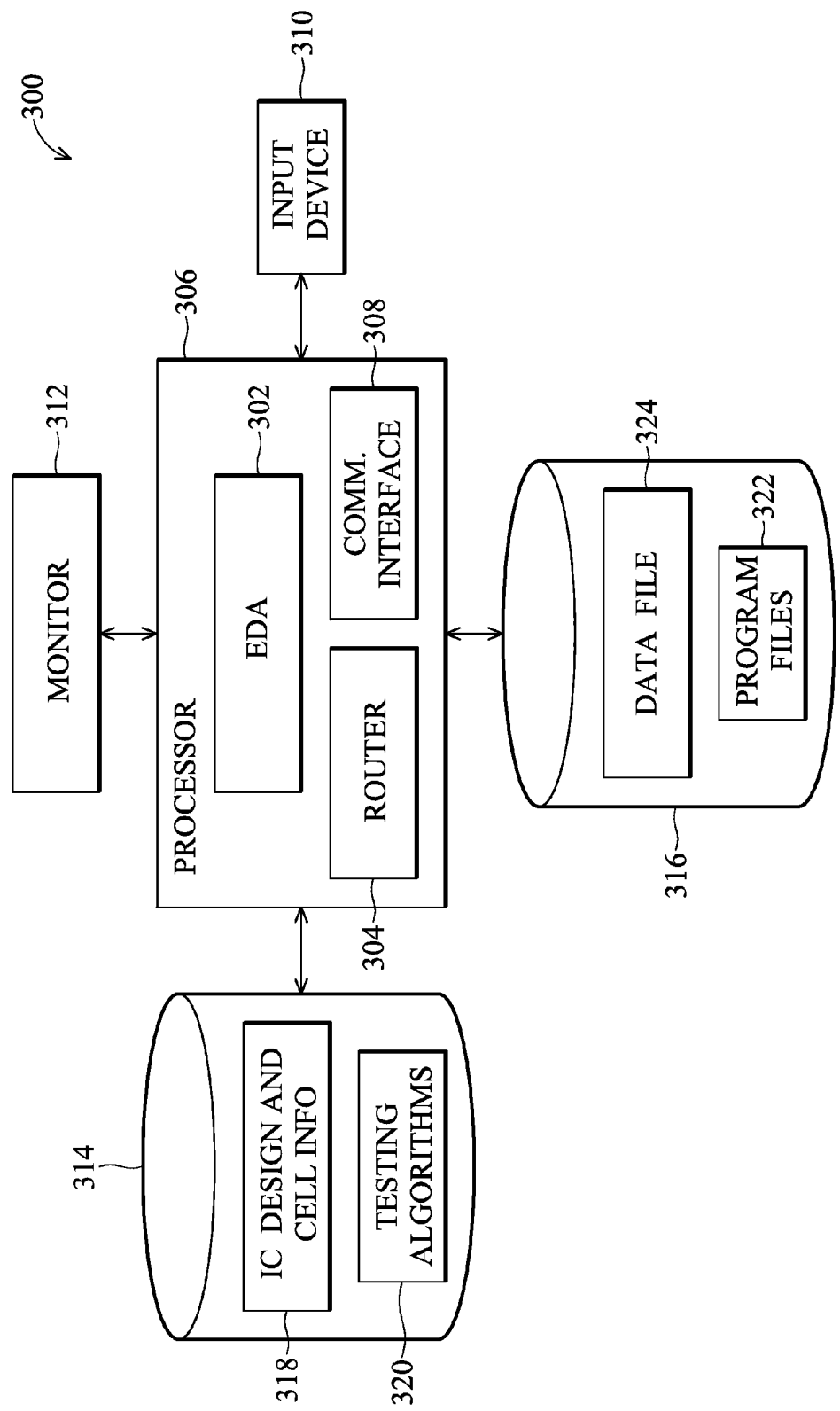
FIG. 8 is a schematic block diagram of one example of automated testing equipment.

Certain steps of the method 200 described above may be performed using a system, such as the computer-based system 300 illustrated in FIG. 8. As shown in FIG. 8, the system 300 may include testing equipment and/or an electronic design automation tool such as "IC COMPILER"™, sold by Synopsis, Inc. of Mountain View, Calif., having a router 304 such as "ZROUTE"™, also sold by Synopsis. Other EDA tools may be used, such as, for example, the "VIRTUOSO" custom design platform or the Cadence "ENCOUNTER"® digital IC design platform along with the "VIRTUOSO" chip assembly router, all sold by Cadence Design Systems, Inc. of San Jose, Calif.

The ATE and/or EDA tool 302 is a special purpose computer formed by retrieving stored program instructions 322 from a computer readable storage mediums 314, 316 and executing the instructions on a general purpose processor 306. Processor 306 may be any central processing unit (CPU), microprocessor, micro-controller, or computational device or circuit for executing instructions. Processor 306 may be configured to perform circuit simulations based on a plurality of data stored in the one or more computer readable storage mediums 314, 316.

The computer readable storage medium 314, 316 may include one or more registers, a random access memory (RAM) and/or a more persistent memory, such as a ROM. Examples of RAM include, but are not limited to, SRAM or dynamic random-access memory (DRAM). A ROM may be implemented as a programmable read-only memory (PROM), an erasable programmable read-only memory (EPROM), an electrically erasable programmable read-only memory (EEPROM), magnetic or optical storage media, as will be understood by one skilled in the art.

System 300 may include a monitor 310 and a user interface or input device 312 such as, for example, a mouse, a touch screen, a microphone, a trackball, a keyboard, or like device through which a user may input design instructions and/or data. The one or more computer readable storage mediums 314, 316 may store data input by a user, testing algorithms 320, IC design and cell information 318, and data files 324, such as GDSII files, representing a physical layout of a circuit. Computer readable storage mediums 314, 316 may also store various transistor models in a variety of formats including, but not limited to, BSIM3, BSIM4, PSP, and HiSIM to name a few.

ATE/EDA tool 302 may include a communication interface 308 allowing software and data to be transferred between ATE/EDA tool 302 and external devices. Example communications interfaces 308 include, but are not limited to, modems, Ethernet cards, wireless network cards, Personal Computer Memory Card International Association (PCMCIA) slots and cards, or the like. Software and data transferred via communications interface 308 may be in the form of signals, which may be electronic, electromagnetic, optical, or the like that are capable of being received by communications interface 308. These signals may be provided to communications interface 308 via a communication path (e.g., channel), which may be implemented using wire, cable, fiber optics, a telephone line, a cellular link, a radio frequency (RF) link, to name a few. Testing algorithms 320 may be used to provide RES signals to pads disposed on the device under test, i.e., the integrated circuit or wafer on which calibration circuit 100 is disposed, for a variety of technology nodes (e.g., technology greater than, less than, or equal to 0.25 μm).

The sense amplifier calibration circuit disclosed herein advantageously enables the trip point of sense amplifiers to be determined in silicon across a variety of PVT combinations and may advantageously be used to characterize the sense amplifier performance for low $V_{CC}$ values in 0.25 μm technology, 0.18 μm technology, and beyond.

Thus, an integrated circuit is disclosed that includes a sensing circuit, a fuse box, and a fuse bus decoder. The sensing circuit includes an output node, and the fuse box includes a plurality of switches coupled in series with a plurality of resistive elements. The fuse box is coupled to the output node of the sensing circuit from which the fuse box is configured to receive a current. The fuse bus decoder is coupled to the fuse box and includes at least one demultiplexer configured to receive a first signal and in response output a plurality of control signals for selectively opening and closing the switches of the fuse box to adjust a resistance across the fuse box. A voltage of the output node of the sensing circuit is based on a resistance of the fuse box and the current.

Also disclosed is an integrated circuit including a sense amplifier coupled to a reference circuit that provides a reference current. A fuse box is coupled to an output node of the sense amplifier from which it is configured to receive a mirrored reference current. The fuse box includes a first configurable resistance segment having a first pass gate coupled in series with a first resistor and a second pass gate coupled in series with a second resistor. The first pass gate and first resistor are coupled in parallel with the second pass gate and second resistor. A first demultiplexer is configured to receive a first signal and in response output a plurality of control signals for selectively opening and closing the first and second pass gates to adjust a resistance of the fuse box. A voltage of the output node of the sense amplifier is based on a resistance of the fuse box and the mirrored reference current.

A method is also disclosed in which a first signal is received at an input of a demultiplexer and in response a first plurality of control signals are output from the demultiplexer to a first plurality of switches. The first plurality of switches are selectively opened and closed in response to receiving the first plurality of control signals to adjust a resistance of a fuse box in which the first plurality of switches are disposed. A voltage is output from an output node of the sense amplifier coupled to the fuse box. A magnitude of the voltage output from the output node is based on a current passing through the fuse box from the output node and the resistance of the fuse box.

The disclosed method may be partially embodied in the form of computer-implemented processes and apparatus for practicing those processes. The disclosed method may also be partially embodied in the form of computer program code embodied in tangible machine readable storage media, such as random access memory (RAM), floppy diskettes, read only memories (ROMs), CD-ROMs, hard disk drives, flash memories, or any other machine-readable storage medium, wherein, when the computer program code is loaded into and executed by a computer, the computer becomes an apparatus for practicing the invention. The disclosed method may also be partially embodied in the form of computer program code loaded into and/or executed by a computer, such that, when the computer program code is loaded into and executed by a computer, the computer becomes an apparatus for practicing the method. When implemented on a general-purpose processor, the computer program code segments configure the processor to create specific logic circuits. The disclosed method may alternatively be partially embodied in a digital signal processor formed of application specific integrated circuits for performing the method.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An integrated circuit, comprising:
   a sensing circuit having an output node;
   a fuse box coupled to the output node of the sensing circuit from which the fuse box is configured to receive a current, the fuse box includes a plurality of switches respectively coupled in series with a plurality of resistive elements; and
   a fuse bus decoder coupled to the fuse box and including at least one demultiplexer configured to receive a signal and in response output a plurality of control signals for selectively opening and closing the switches of the fuse box to adjust a resistance across the fuse box by coupling together different combinations of the plurality of resistive elements,
   wherein a voltage at the output node of the sensing circuit is based on the current and the resistance across the fuse box.

2. The integrated circuit of claim 1, further comprising
   a reference circuit including a resistor coupled in series with a first transistor of the sensing circuit through which a reference current flows, a magnitude of the reference current based on a value of the resistor,
   wherein the current received by the fuse box is based on the reference current.

3. The integrated circuit of claim 1, wherein the fuse box includes
   a first configurable resistance segment including a first switch of the plurality of switches coupled in series with a first resistive element of the plurality of resistive elements and a second switch of the plurality of switches coupled in series with a second resistive element of the plurality of resistive elements, and
   a second configurable resistance segment coupled in series with the first configurable resistance segment, the second configurable resistance segment including a third switch of the plurality of switches coupled in series with a third resistive element of the plurality of resistive elements and a fourth switch of the plurality of switches coupled in series with a fourth resistive element of the plurality of resistive elements.

4. The integrated circuit of claim 3, wherein each of the switches of the first configurable resistance segment are selectively opened and closed in response to control signals received from a first demultiplexer of the fuse bus decoder.

5. The integrated circuit of claim 4, wherein each of the switches of the second configurable resistance segment, are selectively opened and closed in response to, control signals received from a second demultiplexer of the fuse bus decoder.

6. The integrated circuit of claim 1, wherein the plurality of resistive elements includes a plurality of resistors each having a different resistance value.

7. The integrated circuit of claim 1, wherein the sensing circuit includes:
   a first PMOS transistor having a source coupled to a first voltage supply set at a first voltage potential, a drain coupled to a first node, and a gate coupled to a second node,
   a first NMOS transistor having a source coupled to a second voltage supply set at a second voltage potential and a drain and a gate coupled together and to the first node, and
   a second PMOS transistor having a source coupled to the first voltage supply and a drain and a gate coupled to the second node,
   wherein the second node is coupled to a reference circuit that provides a reference current.

8. The integrated circuit of claim 7, wherein the sensing circuit includes
   a third PMOS transistor having a source coupled to the first voltage supply, a drain coupled to the output node, and a gate coupled to the second node,
   a fourth PMOS transistor having a source coupled to the first voltage supply node, a gate coupled to the output node, and a drain coupled to a fourth node, and
   a second NMOS transistor having a gate coupled to the first node, a source coupled to the second voltage supply, and a drain coupled to the fourth node,
   wherein the fuse box is coupled to the third node.

9. The integrated circuit of claim 8, wherein an inverter has an input coupled to the fourth node and an output coupled to a device configured to provide the signal.

10. An integrated circuit, comprising:
    a sense amplifier coupled to a reference circuit that provides a reference current;
    a fuse box coupled to the sense amplifier and configured to receive a mirrored reference current from an output node of the sense amplifier, the fuse box including
      a first configurable resistance segment comprising a first pass gate coupled in series with a first resistor, and a second pass gate coupled in series with a second resistor, the first pass gate and first resistor coupled in parallel with the second pass gate and second resistor; and
    a first demultiplexer configured to receive a first signal and in response output a plurality of control signals for selectively opening and closing the first and second pass gates to adjust a resistance of the fuse box by coupling together different combinations of the first and second resistors,
    wherein a voltage of the output node of the sense amplifier is based on the reference current and the resistance of the fuse box.

11. The integrated circuit of claim 10, wherein the fuse box includes a second configurable resistance segment coupled in series with the first configurable resistance segment, the second configurable resistance segment comprising a third pass gate coupled in series with a third resistor and a fourth pass gate coupled in series with a fourth resistor, the third pass gate and third resistor coupled in parallel, with the fourth pass gate and fourth resistor.

12. The integrated circuit of claim 11, further comprising a second demultiplexer configured to receive a second signal and in response output a second plurality of control signals for selectively opening and closing the third and fourth pass gates to adjust the resistance of the fuse box and the voltage at the output node of the sense amplifier.

13. The integrated circuit of claim 12, wherein each of the first and second configurable resistance segments includes a plurality of pass gates coupled in series with a respective resistor.

14. The integrated circuit of claim 12, wherein the fuse box includes a third configurable resistance segment coupled in series between the first configurable resistance segment and the second configurable resistance segment, the third configurable resistance segment comprising a fifth pass gate coupled in series with a fifth resistor and a sixth pass gate coupled in series with a sixth resistor, the fifth pass gate and fifth resistor coupled in parallel with the sixth pass gate and sixth resistor.

15. The integrated circuit of claim 14, further comprising a third demultiplexer configured to receive a third signal and in response output a third plurality of control signals for selectively opening and closing the pass gates of the third configurable resistance segment to adjust the resistance of the fuse box.

16. A method, comprising:
receiving a first signal at an input of a first demultiplexer;
outputting a first plurality of control signals from the demultiplexer to a first plurality of switches in response to receiving the first signal;
selectively opening and closing the first plurality of switches in response to receiving the first plurality of control signals to adjust a resistance of a fuse box in which the first plurality of switches are disposed; and
outputting a voltage from an output node of a sense amplifier coupled to the fuse box in response to the adjusting resistance of the fuse box, a magnitude of the voltage based on a current passing through the fuse box and the resistance of the fuse box.

17. The method of claim 16, wherein each of the plurality of switches are coupled in series with a respective resistive element.

18. The method of claim 16, further comprising:
receiving a second signal at an input of a second demultiplexer;
outputting a second plurality of control signals from the second demultiplexer to a second plurality of switches in response to receiving the second signal; and
selectively opening and closing the second plurality of switches in response to receiving the second plurality of control signals to, adjust the resistance of the fuse box.

19. The method of claim 18, wherein the first plurality of switches are disposed in parallel with each other and at least one of the first plurality of switches is coupled in series with a resistive element.

20. The method of claim 19, wherein the second plurality of switches are disposed in parallel with each other and are coupled in series with the first plurality of switches, each of the second plurality of switches disposed in series with a respective resistive element.

* * * * *

UNITED STATES PATENT AND TRADEMARK OFFICE
CERTIFICATE OF CORRECTION

| | | |
|---|---|---|
| PATENT NO. | : 8,207,783 B2 | |
| APPLICATION NO. | : 12/856824 | |
| DATED | : June 26, 2012 | |
| INVENTOR(S) | : Wei-Li Liao et al. | |

It is certified that error appears in the above-identified patent and that said Letters Patent is hereby corrected as shown below:

Column 9, Line 5, Claim 11, delete the "," after the word "parallel".

Column 10, Line 23, Claim 18, delete the "," after the word "to".

Signed and Sealed this
Sixteenth Day of October, 2012

David J. Kappos
*Director of the United States Patent and Trademark Office*